United States Patent [19]
Sato et al.

[11] Patent Number: 6,097,101
[45] Date of Patent: Aug. 1, 2000

[54] PACKAGE FOR SEMICONDUCTOR DEVICE HAVING FRAME-LIKE MOLDED PORTION AND PRODUCING METHOD OF THE SAME

[75] Inventors: Takeshi Sato; Kenichi Sakaguchi; Hiromi Tokunaga, all of Nagano, Japan

[73] Assignee: Shinko Electric Industries Co., Ltd., Nagano, Japan

[21] Appl. No.: 09/240,652

[22] Filed: Jan. 29, 1999

[30] Foreign Application Priority Data

Jan. 30, 1998 [JP] Japan .................................. 10-019489

[51] Int. Cl.[7] ........................................................ H04L 3/28
[52] U.S. Cl. ............................................. 257/787; 257/698
[58] Field of Search ..................................... 257/787, 692, 257/698, 710, 797; 438/125, 126, 128

[56] References Cited

U.S. PATENT DOCUMENTS

| | | |
|---|---|---|
| 5,394,011 | 2/1995 | Yamamoto et al. . |
| 5,729,437 | 3/1998 | Hashimoto et al. . |
| 5,736,789 | 4/1998 | Moscicki et al. . |
| 5,737,191 | 4/1998 | Horiuchi et al. . |
| 5,940,271 | 8/1999 | Mertol . |
| 6,011,304 | 1/2000 | Mertol . |

FOREIGN PATENT DOCUMENTS 7-307403  11/1995  Japan .

*Primary Examiner*—Sheila V. Clark
*Attorney, Agent, or Firm*—Pennie & Edmonds LLP

[57] ABSTRACT

The object of the present invention is to provide a premolded-type package for a semiconductor device which can be produced easily and exhibits a good airtightness, and to provide a method for effectively producing the same. A package for a semiconductor device has a wiring substrate 32 having a resin substrate 35 which is provided on its one surface with a wiring pattern 37, a chip-mounting portion 36 and a frame-like pattern 38 of a metal surrounding the wiring pattern 37 and the chip-mounting portion 36, and on the other surface with a plurality of terminals 41 electrically connected to the wiring pattern, and a frame-like molded portion 45 of thermosetting resin, molded on the frame-like pattern 38 on the wiring substrate 32.

19 Claims, 8 Drawing Sheets

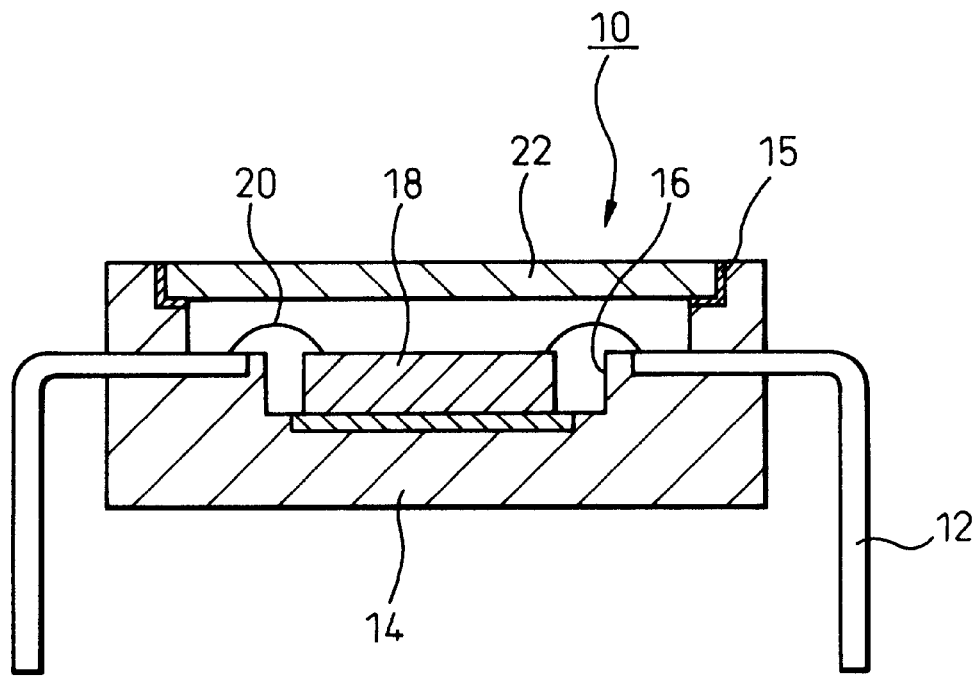

PACKAGE FOR SEMICONDUCTOR DEVICE HAVING FRAME-LIKE MOLDED PORTION AND PRODUCING METHOD OF THE SAME

BACKGROUND OF THE INVENTION

1. Field of the Invention

The present invention relates to a package for a semiconductor device having a mold frame and a production method thereof.

2. Description of the Related Art

Generally, in a resin-sealed semiconductor device, a semiconductor chip is mounted on a chip-mounting portion of a lead frame, and the semiconductor chip is electrically connected to leads by wires, and thereafter, the semiconductor chip is sealed by sealing resin.

On the contrary to the above, there is a package known as a pre-molded package which has a pre-molded portion having a recessed chip-mounting portion in an insert molding process in which the lead frame is inserted. In the package, a semiconductor chip is mounted on the chip-mounting portion, and the semiconductor chip is electrically connected to a wiring pattern provided around the chip-mounting portion, by wires, and thereafter, the chip-mounting portion is sealed by a lid to obtain a semiconductor device.

In recent years, the latter type of simple packages (i.e., pre-molded packages) have been used for various purposes owing to an enhanced airtightness due to an improvement of a passivation film of the semiconductor chip proper or an adhesive to seal the lid of the molded package.

FIG. 11 shows a schematic sectional view of a package 10 described above as a pre-molded package. 12 designates a lead frame, and 14 designates a molded portion. As shown in the drawing, the package in which the lead frame 12 and the molded portion 14 are integrated in advance is provided. A semiconductor chip 18 is mounted on a recessed chip-mounting portion 16. The semiconductor chip 18 is electrically connected to the lead frame 12 by wires 20. A lid 22 is cemented to the molded portion 14 by an adhesive 15 to cover the chip-mounting portion 16 so as to seal the semiconductor chip 18. Thus, the package can be used as a DIP type or gull-wing type semiconductor device.

However, a known package using the lead frame as described above has problems as follows.

The package is simple in structure, but is complex in the production process since after molding the molded portion 14 by a transfer molding as in a conventional resin-sealed semiconductor device, it is essential to remove a dam bar (not shown) which is provided to prevent resin from flowing out between the leads, and to remove any resin flash which has reached the dam bar between the leads.

SUMMARY OF THE INVENTION

The present invention is aimed at an elimination of the above problems. An object of the present invention is to provide a pre-molded type semiconductor package which can be produced easily and has high airtightness, and to provide a production method thereof.

The present invention is constructed as follows to achieve the above object.

Namely, in a package for a semiconductor device according to the present invention, a wiring pattern and a chip-mounting portion are formed on one surface of a resin substrate; a metal frame pattern surrounding the wiring pattern and the chip-mounting portion is formed on the one surface of the substrate; a plurality of terminals electrically connected to the wiring pattern is formed on the other surface of the resin substrate; and a frame portion made of thermosetting resin is molded on the frame pattern of the resin substrate.

The metal frame pattern interposed between the resin substrate and the molded portion improves adhesion and airtightness therebetween. Therefore, according to the present invention, a premolded-type package for a semiconductor device which can be produced easily and which has high airtightness, can be obtained.

If the frame (box-shaped) pattern is made of a copper layer, the airtightness can be further improved. Since no lead frame is used, it is not necessary to remove a dam bar or resin flashes.

If bumps for external connection are formed on the terminals, a package which can be easily surface-mounted on an external substrate can be obtained.

The present invention provides a method for producing a package for a semiconductor device, comprising the steps of forming a wiring pattern, a chip-mounting portion, and a frame-like (box-shaped) pattern made of a metal surrounding the wiring pattern and the chip-mounting portion, on one surface of a resin substrate; forming a plurality of terminals electrically connected to the wiring pattern on the other surface opposite to the one side of the resin substrate; and molding a frame portion of thermosetting resin on the frame pattern by an injection molding or a transfer molding.

It is possible to form bumps for external connection on the terminals.

The present invention further provides a package for a semiconductor device, comprising a wiring substrate having a resin substrate which is provided, on its one surface, with a wiring pattern, a chip-mounting portion and a frame-like (box-shaped) pattern made of thermosetting resin surrounding the wiring pattern and the chip-mounting portion and which is provided on the other surface with a plurality of terminals electrically connected to the wiring pattern; and, a frame portion of thermosetting resin molded on the frame pattern of the wiring substrate.

The frame pattern of thermosetting resin interposed between the resin substrate and the molded portion improves adhesion and airtightness therebetween. Since no lead frame is used, it is not necessary to remove a dam bar or resin flashes.

If bumps for external connection is formed on the terminals, a package which can be easily mounted on an external substrate can be provided.

The present invention provides a method for producing a package for a semiconductor device, comprising the steps of forming a wiring pattern and a chip-mounting portion on one surface of a resin substrate; forming a frame-like (box-shaped) pattern of thermosetting resin to surround the wiring pattern and the chip-mounting portion on the one surface of the resin substrate; forming a plurality of terminals electrically connected to the wiring pattern, on the other surface of the resin substrate; and molding a frame portion made of thermosetting resin on the frame pattern by an injection molding or transfer molding.

It is possible to provide a step of forming bumps for external connection on the terminals.

It is preferable to provide a step of illuminating the box-shaped pattern of thermosetting resin with ultraviolet (UV) radiation to activate the box-shaped pattern.

The present invention further provides a package for a semiconductor device comprising a wiring substrate having a resin substrate which is provided on its one surface with a wiring pattern, a chip-mounting portion and a frame-like (box-shaped) pattern made of metal surrounding the wiring pattern and the chip-mounting portion, said resin substrate being provided with holes on the portion thereof corresponding to the wiring pattern; a frame portion of thermosetting resin molded on the frame pattern of the wiring substrate.

The box-shaped pattern of metal inserted between the resin substrate and the molded portion improves adhesion and airtightness therebetween. If the box-shaped pattern is made of a copper layer, the adhesiveness can be further enhanced. Since no lead frame is used, it is not necessary to remove a dam bar or resin flashes.

If bumps for external connection, which partly extrude from the holes and which are electrically connected to the wiring pattern, are provided, a package which can be easily mounted on an external substrate can be provided.

The present invention further provides a package for a semiconductor device, comprising a wiring substrate having a resin substrate which is provided on its one surface with a wiring pattern, a chip-mounting portion and a frame-like (box-shaped) pattern of thermosetting resin surrounding the wiring pattern and the chip-mounting portion; the chip-mounting portion, said resin substrate being provided with holes on the portion thereof corresponding to the wiring pattern; a molded portion made of thermosetting resin molded on the box-shaped pattern of the wiring substrate.

If bumps for external connection, which partly extrude from the holes and which are electrically connected to the wiring pattern, are provided, a package which can be easily surface-mounted on an external substrate can be provided.

DESCRIPTION OF THE PREFERRED EMBODIMENTS

Preferred embodiments of the present invention will be describe below with reference to the attached drawings.

Figure 1:
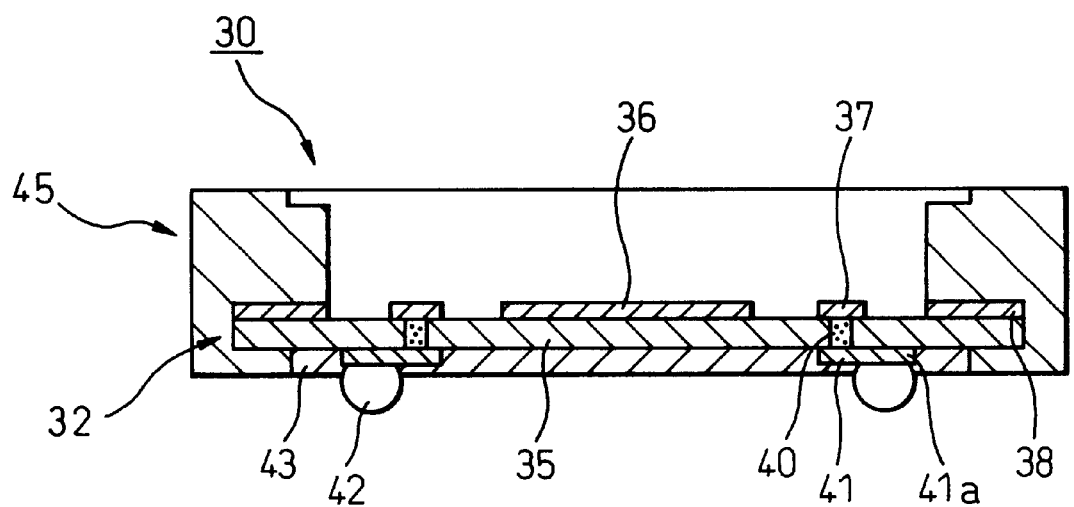
FIG. 1 shows a sectional view of an embodiment of a package for a semiconductor device according to the present invention.

FIG. 1 shows a sectional view of an embodiment of a semiconductor package 30.

A wiring substrate 32 has a resin substrate 35 made of a polyimide resin film or the like, which is provided on its one surface with a chip-mounting portion 36 of a copper layer, a wiring pattern 37, and a frame-like (box-shaped) pattern 38 of a metal layer such as a copper layer or a thermosetting resin layer, which surrounds the chip-mounting portion 36 and the wiring pattern 37. The resin substrate 35 has via holes 40 extending therethrough and filled with a conductive material, such as conductive resin or the like, a wiring pattern 41 which is electrically connected to the wiring pattern 37 through the via holes 40 and which is formed on the other surface of the resin substrate 35, and terminals 41a in the form of lands provided at the end portion of the wiring pattern 41.

The terminals 41a are provided with bumps 42 such as solder bumps for external connection in accordance with need. Note that 43 designates the solder resist layer formed to cover the other side of the resin substrate 35.

Although the wiring substrate 32 is made of one layer in the embodiment, but it is possible to provide a multi-layered substrate.

The chip-mounting portion 36 is not necessarily made of a copper layer, and can be made of a surface portion of the resin substrate 35. 45 designates the molded portion of tharmosetting resin.

The molded portion 45 can be formed in the shape of a frame or box on the box-shaped pattern 38, as shown in the drawings, by an injection molding or a transfer molding in which the wiring substrate 32 is inserted in a molding die. Especially, the molded portion 45 is formed to surround the side portions of the resin substrate 35 and box-shaped pattern 38 to prevent moisture permeating through the side portions of the package.

Figure 3:
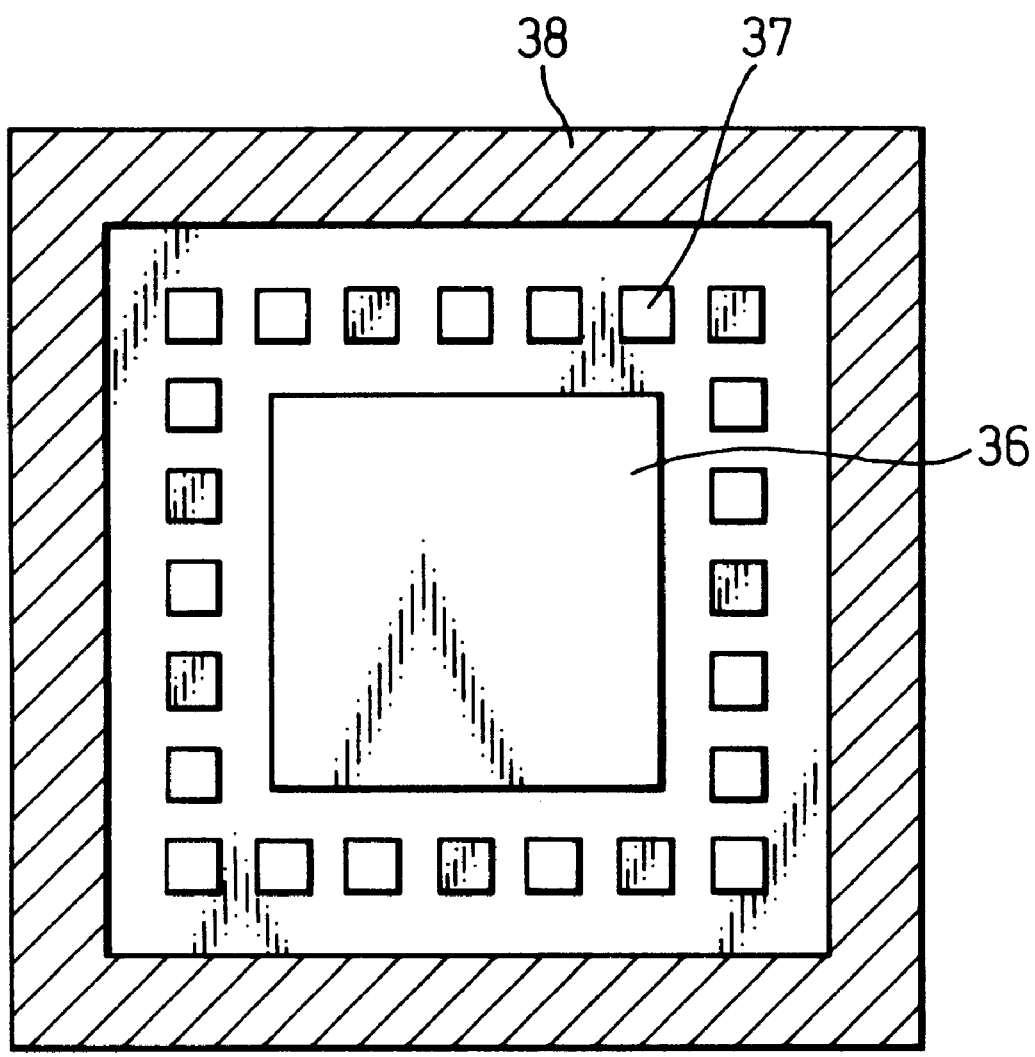
FIG. 3 shows an explanatory view of an embodiment of a pattern formed on one surface of a resin substitute.

As shown in FIG. 3, the molded portion 45 of thermosetting resin and the resin substrate 35 can be tightly adhered via the box-shaped pattern 38 of a metal layer or a thermosetting layer.

In case of the box-shaped pattern 38 made of a metal layer, the adhesive connection and accordingly the airtightness between the box-shaped pattern 38 and the resin substrate 35 are good if the resin substrate 35 is made of two or three layers of a polyimide film with a metal foil (the metal foils and the polyimide films are adhered directly, or the metal foils and the polyimide films are adhered via an adhesive layer), or a printed circuit board is used. It has been found that if the box-shaped pattern 38 is made of a metal layer or thermosetting resin layer, the box-shaped pattern 38 and the molded portion 45 can be tightly connected.

Especially, if the metal layer is made of copper, the copper layer and the molded portion 45 of thermosetting resin can be extremely tightly connected.

This would be because if the box-shaped pattern 38 is made of a copper layer, an oxide film produced on the surface of the copper layer contributes to an enhanced connection.

Note that good airtightness cannot be obtained in the case of the molded portion 45 of thermosetting resin.

If the box-shaped pattern 38 is made of a thermosetting resin layer, a good connection (adhesiveness) between the resin substrate 35 and the pattern 38, and between the molded portion 45 made of a thermosetting resin (for example, epoxy resin), can be obtained.

The box-shaped pattern 38 of a thermosetting resin layer can be formed by coating the resin substrate 35 with thermosetting resin in the shape of a frame or box. In this case, the box-shaped pattern 38 is set due to heat generated when the molded portion 45 is thermally set. When a thermosetting resin is coated on the resin substrate 35 in the form of a frame, the box-shaped pattern 38 can be irradiated by ultraviolet (UV) light to activate the thermosetting resin so that a tight connection therebetween can be improved.

Note that the box-shaped pattern 38 is not necessarily a continuous pattern. Namely, the pattern can be discontinuous, so long as the pattern has an area large enough to ensure a tight connection between the resin substrate 35 and the molded portion 45.

The wiring substrate 32 can be formed by a known method.

FIG. 2(a) to FIG. 2(d) show an example of the production process thereof.

First of all, a polyimide resin film 35 laminated with a metal foil on one surface thereof is irradiated at predetermined portions thereof by laser light to form holes 40a. A conductive material is filled in the holes 40a to form via holes 40 (FIG. 2(a)). Alternatively, it is possible to form the conductive via holes 40 by a plating of Ni, Cu, Sn, Pb—Sn and so forth. In the plating operation, the metal foil can be used as a power supply layer.

Figure 2A:
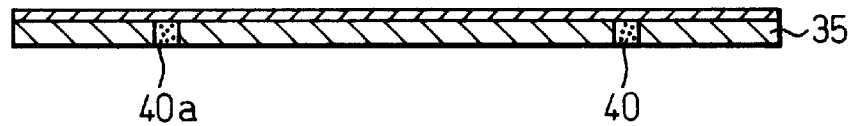
FIGS. 2a to 2d show explanatory views of an embodiment of a production process of a package shown in FIG. 1.
Figure 2B:
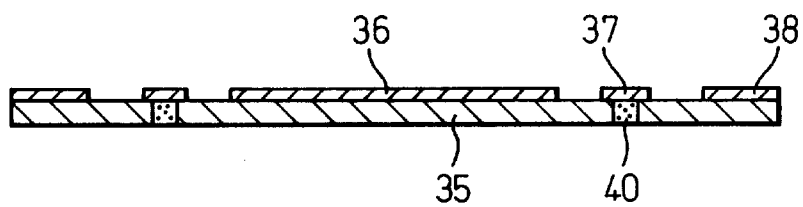
Figure 2C:
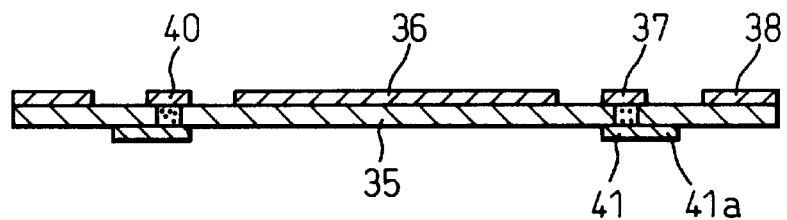
Figure 2D:
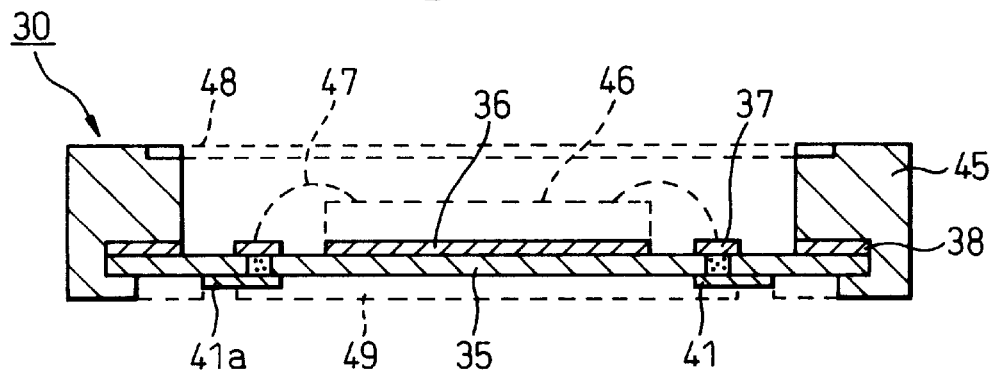

Next, the metal foil is etched by a photolithographic method to form the chip-mounting portion 36, the wiring pattern 37 and the box-shaped pattern 38 (FIG. 2(b)). FIG. 3 shows a plan view of an example of a pattern thus obtained.

Note that it is possible to form the chip-mounting portion 36, the wiring pattern 37 and the box-shaped pattern 38 by a known additive method using a plating.

Next, a metal layer is formed on the other surface of the polyimide resin film 35. It is also possible to form a predetermined thickness of the metal layer by adhesion of a metal foil thereto, or by an electroless plating, an electrolytic plating, or an additive process.

The metal layer is etched in the same way as above to form the wiring pattern 41 and the land-like terminals 41a.

When the box-shaped pattern 38 is made of a thermosetting resin layer, a process of coating thermosetting resin on the peripheral edge portion of the polyimide resin film 35, and a process of irradiating UV light onto the thermosetting resin layer, if necessary, are conducted in an appropriate step.

The wiring substrate 32 is composed of one layer in an embodiment shown in FIG. 2. However, it is possible to make the same of multiple layers by a known build-up method. In the multi-layer structure, the chip-mounting portion 36, the wiring portion 37 and the box-shaped pattern 38 are formed on the uppermost surface layer (one surface thereof), and the wiring pattern 41 and the terminals 41a, which are electrically connected to the wiring pattern 37, are formed on the lowermost surface layer (the other surface thereof).

The wiring substrate 32 formed as described above is inserted in a molding cavity, and then, the molded portion 45 is molded of thermosetting resin on the box-shaped pattern 38 by an injection molding or a transfer molding, and thus, a package is completed.

It is preferable that a solder resist be coated and cured on the portion of the other surface of the polyimide resin film 35 other than the terminals 41a to form a protective coat 49.

It is possible to form bumps made of solder balls or the like at the terminals 41a in a package.

The semiconductor chip 46 is mounted on the chip-mounting portion 36 of the package 30. The semiconductor chip 46 and the wiring pattern 37 are electrically connected by wires 47. The chip-mounting portion 36 is covered by the lid 48 to seal the semiconductor chip 46, and thus, a semiconductor device is completed. The lid 48 is made of resin or a transparent glass and connected to the molded portion 45 by an adhesive.

Alternatively, it is possible to fill a potting resin (not shown) in the molded portion 45 to seal the semiconductor chip.

The above discussion has been directed to a production method of a single package, but it is possible to make wiring substrates 32 having a plurality of interconnected patterns of a sheet blank, and to mold the molded portion 45. After that, the sheet is cut to obtain separate packages. Alternatively, it is also possible to continuously form the wiring substrates and mold the molded portions by the use of a hoop blank coiled into a roll.

Figure 4:
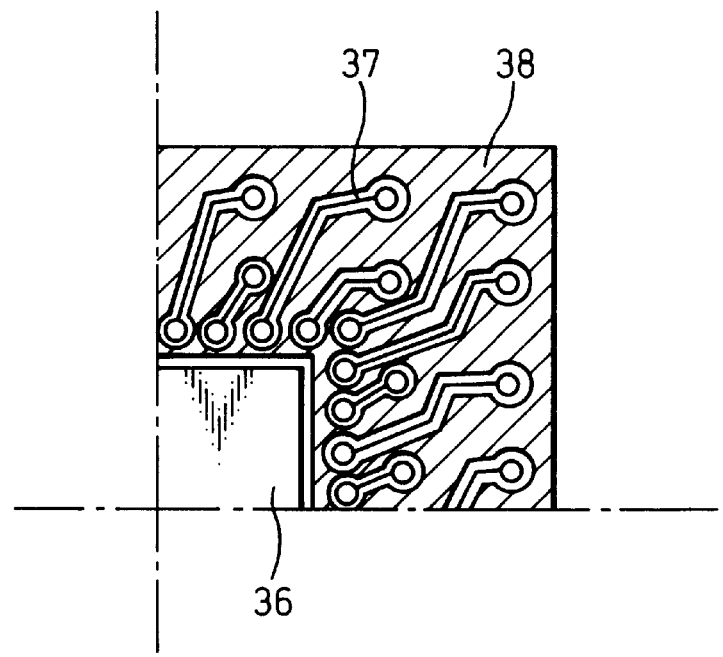
FIG. 4 shows an explanatory view of another embodiment of a pattern formed on one surface of a resin substitute.

FIG. 4 shows another embodiment of the chip-mounting portion 36, the wiring pattern 37 and the box-shaped pattern 38.

In this arrangement, the box-shaped pattern 38 is formed within an area for the wiring pattern 37. The hatched portion refers to an area in which the molded portion 45 is formed. It can be seen that the molded portion 45 is formed on the portion of the wiring pattern 37 other than a wire bonding portion. With this pattern arrangement, the molded portion 45 can be placed on the inner side of a package, thus resulting in a miniaturization of the package. In addition, the freedom of a design of the wiring pattern 37 can be enhanced.

Figure 5:
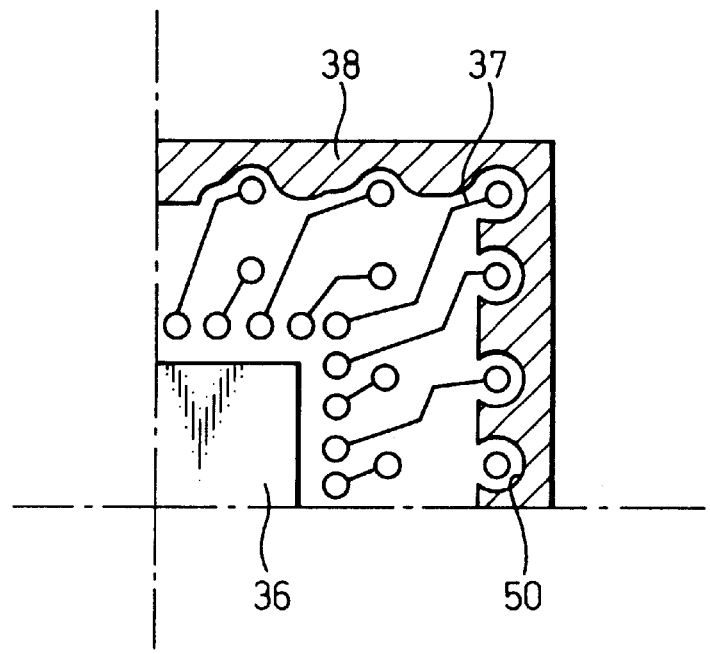
FIG. 5 shows yet another embodiment of a pattern formed on one surface of a resin substitute.

FIG. 5 shows another example of the chip-mounting portion 36, the wiring portion 37 and the box-shaped pattern 38.

In this example, recesses 50 are formed at the inner edge portion of the box-shaped pattern 38. The outer edge portions of the wiring pattern 37 are partly or entirely inserted in the recesses 50. In this arrangement, the molded portion 45 can be placed in the inner portion of a package to miniaturize the package. Additionally, the freedom of design of the wiring pattern 37 can be increased.

FIGS. 6(a) to 6(d) show another production method of a package 30 shown in FIG. 1.

Figure 6A:
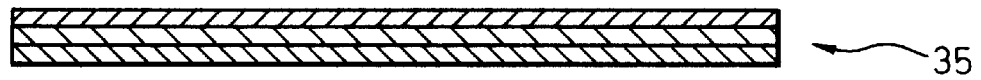
FIGS. 6a to 6d show explanatory views of another embodiment of a production process of a package for a semiconductor device.
Figure 6B:
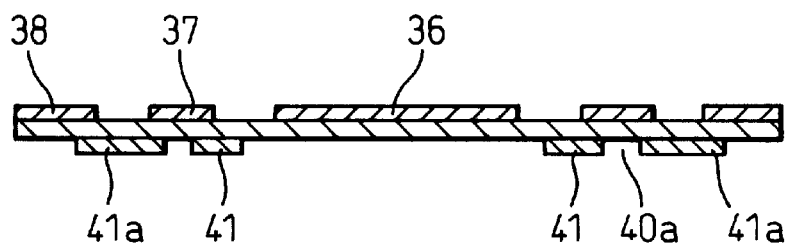
Figure 6C:
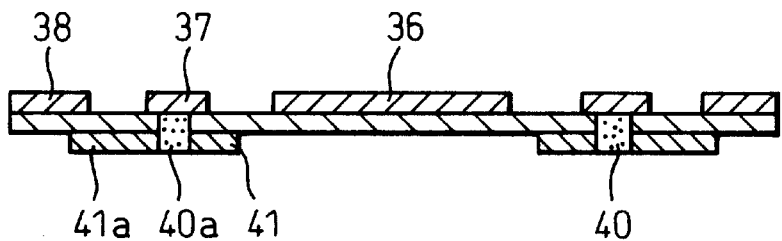
Figure 6D:
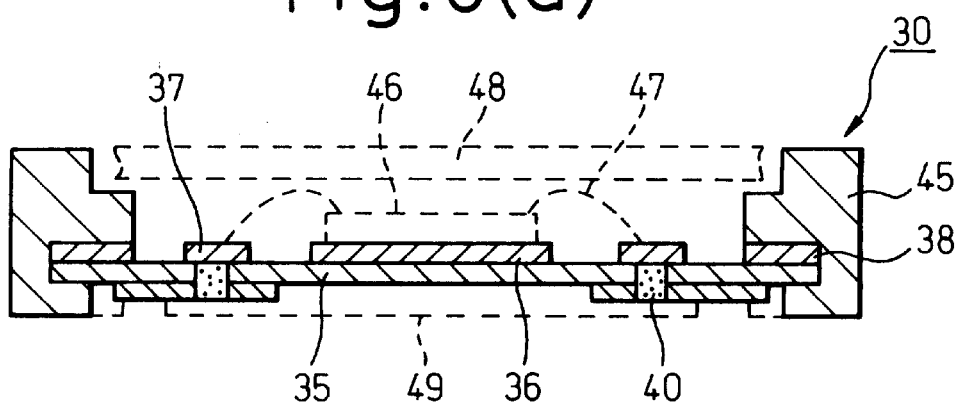

In this method, a resin substrate 35 (shown in FIG. 6(a)) laminated with metal foils on both sides thereof is used.

First, the metal foil on one surface of the substrate is etched by photolithography to form a chip-mounting portion 36, a wiring pattern 37 and a box-shaped pattern 38. The box-shaped pattern 38 may be made of thermosetting resin. It is possible to make the chip-mounting portion 36 of the surface of the resin substrate 35. The metal foil on the other surface of the substrate is also etched by photolithography in the same manner as above, to form the wiring pattern 41 having terminals 41a (FIG. 6(b)). In this process, the etching is carried out so that holes 40a are formed at the portions of the wiring pattern 41 that are to be electrically connected to the wiring patterns 37 and 41.

Next, holes 40a are formed also in the resin substrate 35 by laser or etching. A conductive resin is filled in the holes 40a to form via holes 40 which electrically connect the wiring patterns 37 and 41 provided on opposite sides of the substrate (FIG. 6(c)).

The molded portion 45 is molded of thermosetting resin on the box-shaped pattern 38 in the same manner as described above, and thus, a package is completed.

It is preferable that the portion of the other surface of the resin substrate 35 other than the terminals 41*a* be coated with solder resist which is cured to form a protective coat (FIG. 6(*d*)).

Bumps made of solder balls or the like can be provided at the terminals 41*a* in a package.

In the process, it is possible to make a plurality of packages at one time of a sheet blank, or to continuously make and mold wiring substrates of a hoop blank.

Figure 7:
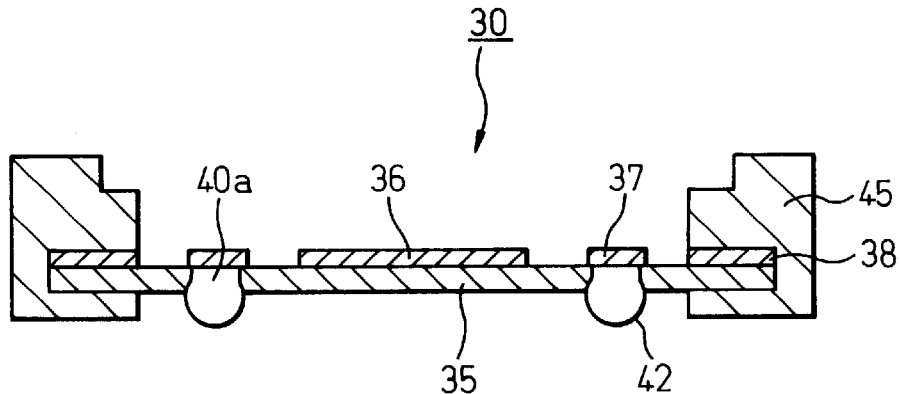
FIG. 7 shows a sectional view of yet another embodiment of a package for a semiconductor device.

FIG. 7 shows yet another embodiment of a package 30.

The same members as those shown in FIG. 1 are represented by like numbers and no duplicate explanation thereof will given hereinafter.

In this embodiment, a part of the wiring pattern 37 is exposed to the holes 40*a* formed in the resin substrate 35, in a completed package 30.

It is possible to complete a package in which the solder balls 42 are directly connected to the wiring pattern 37 so that the balls partly protrude outward from the holes 40*a* to form bumps.

FIG. 8 shows a production process of a package 30 shown in FIG. 7.

Figure 8A:
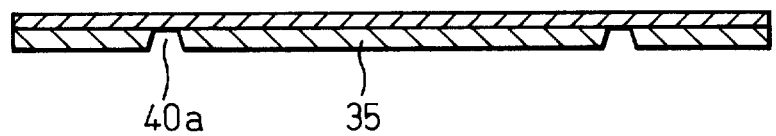
FIGS. 8a to 8c show explanatory views of a production process of a package shown in FIG. 7.

First, the resin substrate 35 coated with metal foil (copper foil, etc.) on one surface thereof is irradiated by the laser beam or is etched to form holes 40*a* (FIG. 8*a*).

Figure 8B:
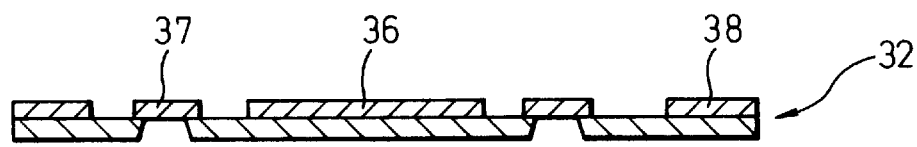

Next, the metal foil is etched by a photolithographic method to form the chip-mounting portion 36, the wiring pattern 37, and the box-shaped pattern 38 so as to obtain the wiring substrate 32 (FIG. 8b). The box-shaped pattern 38 may be made of thermosetting resin. It is also possible to form the chip-mounting portion 36 from the resin substrate 35 itself.

Alternatively, it is possible to form the holes in advance in the resin substrate by stamping, and to apply a metal foil to the resin substrate, and thereafter to pattern the same to obtain the wiring substrate (not shown).

Figure 8C:
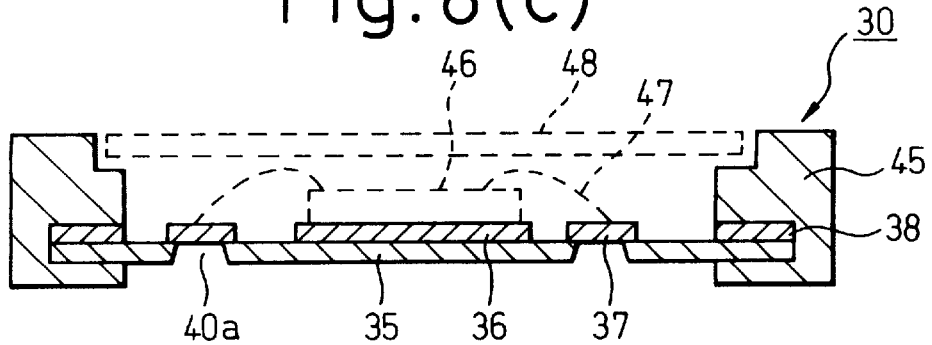

Next, as described above, the molded portion 45 is molded of thermosetting resin on the box-shaped pattern 38 so as to complete a package (FIG. 8*c*). In addition, bumps are formed if required.

In this process, it is possible to form a plurality of packages at one time from a sheet blank. It is also possible to produce resin substrates continuously from a hoop blank and to continuously mold the same.

Figure 9:
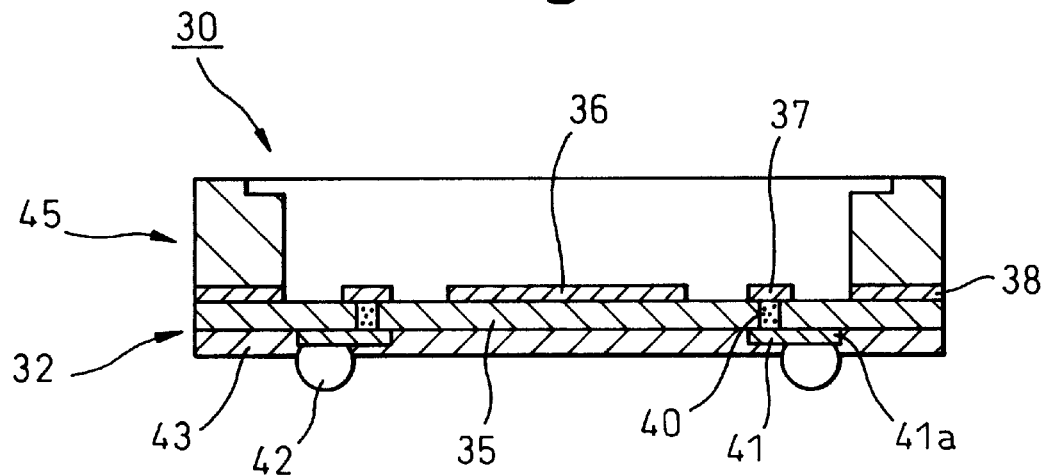
FIG. 9 shows a sectional view of another embodiment of a package for a semiconductor device in which it is not necessary to take into account the problem of permeation of moisture.

FIG. 9 shows a still another embodiment of a package 30 according to the present invention. The same members as those shown in FIG. 1 are indicated by like numbers to omit a duplicate explanations thereof. In this embodiment, the molded portion 45 is formed only on the upper peripheral surface of the wiring substrate 32. There is no molded portion 45 on the side surfaces or bottom surface of the wiring substrate 32. This embodiment can be applied if it is not necessary to seriously consider a problem with moisture which can permeate through the sides of the package 30 at the boundary between the molded portion 45 and the wiring substrate 32.

Figure 10:
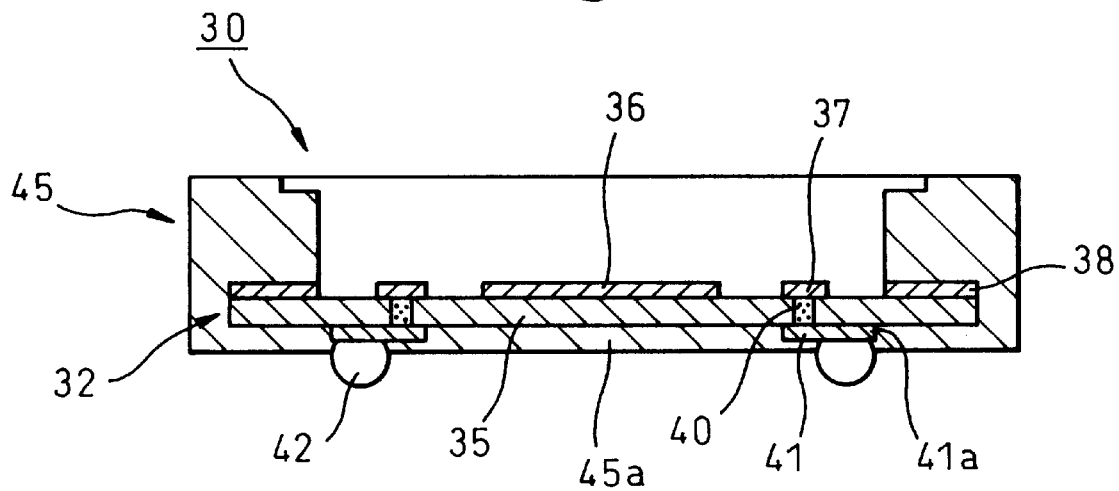
FIG. 10 shows a sectional view of a semiconductor package in which a resin molded portion 45 extends to the bottom surface; and, FIG. 11 shows a sectional view of an example of a known package.

FIG. 10 shows still another embodiment of a package 30. The same members as those shown in FIG. 1 are numbered with like numbers and no explanation thereof will be given. In this embodiment, the molded portion 45 is formed not only on the upper peripheral surface of the wiring substrate but also on the side or the portion of the bottom surface thereof other than the terminals 41*a*. The molded portion 45*a* formed on the bottom surface of the substrate can prevent the wiring substrate 32 from being permeated with moisture and no formation of the solder resist layer (43) is needed.

Although the present invention has been described above in accordance with preferable embodiments, the present invention is, as a matter of course, not limited thereto, and can be modified within the spirit of the invention.

What is claimed is:

1. A package for a semiconductor device with a molded portion, comprising
    a resin substrate having one surface and the other surface opposite thereto;
    a frame-like pattern composed of a wiring pattern and a chip-mounting portion, formed on the one surface of the resin substrate, and a metal portion which surrounds the wiring pattern and the chip-mounting portion;
    a plurality of terminals electrically connected to the wiring pattern and formed on the other surface of the resin substrate;
    a molded portion made of thermosetting resin, molded on the frame-like pattern of the resin substrate.

2. A package for a semiconductor device according to claim 1, wherein the resin substrate and the frame-like pattern have side faces which are surrounded by the molded portion.

3. A package for a semiconductor device according to claim 1, wherein the resin substrate is substantially rectangular, and the frame-like pattern and the molded portion are in the form of a substantially rectangular box along the outer periphery of the substantially rectangular resin substrate.

4. A package for a semiconductor device according to claim 1, wherein the terminals are electrically connected to the wiring pattern through a conductor via holes which extended through the resin substrate.

5. A package for a semiconductor device according to claim 1, wherein bumps for external connection are formed on the terminals.

6. A method for producing a package for a semiconductor device, comprising the steps of
    forming a wiring pattern, a chip-mounting portion, and a frame-like pattern of a metal surrounding the wiring pattern and the chip-mounting portion, on one surface of a resin substrate;
    forming a plurality of terminals electrically connected to the wiring pattern, on the other surface of the resin substrate opposite to the one surface;
    molding a molded portion in the form of a frame, which is made of thermosetting resin on the frame-like pattern by an injection molding or transfer molding.

7. A method for a producing a package for a semiconductor device according to claim 6, comprising the step of forming bumps for external connection on the terminals.

8. A package for a semiconductor device with a molded portion, comprising
    a resin substrate having one surface and the other surface opposite thereto;
    a wiring pattern and a chip-mounting portion formed on one surface of the resin substrate;
    a frame-like pattern of thermosetting resin, formed on the one surface of the resin substrate to surround the wiring pattern and the chip-mounting portion;
    a plurality of terminals electrically connected to the wiring pattern and formed on the other surface of the resin substrate; and
    a molded portion of thermosetting resin molded on the frame-like pattern of the resin substrate.

9. A package for a semiconductor device according to claim 8, wherein the resin substrate and the frame-like pattern have side faces which are surrounded by the molded portion.

10. A package for a semiconductor device according to claim 8, wherein the resin substrate is substantially rectangular, and the frame-like pattern and the molded portion are in the form of a substantially rectangular frame along the outer periphery of the substantially rectangular resin substrate.

11. A package for a semiconductor device according to claim 1, wherein the terminals are electrically connected to the wiring pattern by means of conductors via holes which extend through the resin substrate.

12. A package for a semiconductor device according to claim 8, wherein bumps for external connection are formed on the terminals.

13. A method for producing a package for a semiconductor device, comprising the steps of forming a wiring pattern and a chip-mounting portion on one surface of a resin substrate;

forming a frame-like pattern of thermosetting resin surrounding the wiring pattern and the chip-mounting portion on the one surface of the resin substrate;

forming a plurality of terminals electrically connected to the wiring pattern, on the other surface of the resin substrate opposite to the one surface;

molding a frame-like molded portion of thermosetting resin on the frame-like pattern by injection molding or transfer molding.

14. A method for producing a package for a semiconductor device according to claim 13, comprising the step of forming bumps for external connection on the terminals.

15. A method for producing a package for a semiconductor device according to claim 14, comprising the step of radiating ultraviolet light onto the frame-like pattern of thermosetting resin.

16. A package for a semiconductor device with a molded portion, comprising a resin substrate having one surface and the other surface opposite to the one surface;

a wiring pattern and a chip-mounting portion formed on the one surface of the resin substrate;

a frame-like pattern of thermosetting resin, which surrounds the wiring pattern and the chip-mounting portion;

a molded portion of thermosetting resin, molded on the frame-like pattern of the resin substrate, said resin substrate being provided with holes opening at the position thereof corresponding to the wiring pattern.

17. A package for a semiconductor device according to claim 16, wherein the resin substrate and the frame-like pattern have side faces which are surrounded by the molded portion.

18. A package for a semiconductor device according to claim 16, wherein the resin substrate is substantially rectangular, and the frame-like pattern and the molded portion are in the form of a substantially rectangular frame, along the outer periphery of the substantially rectangular resin substrate.

19. A package for a semiconductor device according to claim 16, having bumps for external connection, which partly extrude from the hole so as to be electrically connected to the wiring pattern.

* * * * *